United States Patent
Li et al.

(10) Patent No.: US 10,128,321 B2
(45) Date of Patent: Nov. 13, 2018

(54) PIXEL ISOLATION WALL, DISPLAY SUBSTRATE, THEIR MANUFACTURING METHODS, AND DISPLAY DEVICE

(71) Applicant: BOE TECHNOLOGY GROUP CO., LTD., Beijing (CN)

(72) Inventors: Wusheng Li, Beijing (CN); Shi Shu, Beijing (CN); Xiaolong He, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/326,373

(22) PCT Filed: Mar. 1, 2016

(86) PCT No.: PCT/CN2016/075113
§ 371 (c)(1),
(2) Date: Jan. 13, 2017

(87) PCT Pub. No.: WO2017/049875
PCT Pub. Date: Mar. 30, 2017

(65) Prior Publication Data
US 2017/0263688 A1    Sep. 14, 2017

(30) Foreign Application Priority Data

Sep. 25, 2015  (CN) .......................... 2015 1 0624357

(51) Int. Cl.
*H01L 29/08*    (2006.01)
*H01L 27/32*    (2006.01)
(Continued)

(52) U.S. Cl.
CPC .......... *H01L 27/3246* (2013.01); *G02F 1/161* (2013.01); *H01L 27/3262* (2013.01);
(Continued)

(58) Field of Classification Search
CPC . H01L 27/3246; H01L 27/3262; H01L 51/56; H01L 51/0004; H01L 51/5012;
(Continued)

(56) References Cited

U.S. PATENT DOCUMENTS 7,754,275 B2 *  7/2010  Mitsuhashi ......... H01L 27/3246
                                                    427/271
8,531,102 B2 *  9/2013  Takagi .................... H05B 33/10
                                                    313/498

(Continued)

FOREIGN PATENT DOCUMENTS

CN          1815749 A      8/2006
CN         101060071 A    10/2007
(Continued)

OTHER PUBLICATIONS

1$^{st}$ Chinese Office Action, English Translation.
(Continued)

*Primary Examiner* — Thinh T Nguyen
(74) *Attorney, Agent, or Firm* — Brooks Kushman P.C.

(57) ABSTRACT

The present disclosure provides a pixel isolation wall and its manufacturing method. The pixel isolation wall includes an oleophilic layer arranged on a substrate on which a TFT array and a pixel electrode array is formed, and an oleophobic layer arranged on the oleophilic layer and configured to define, together with the oleophilic layer, a plurality of recess regions corresponding to the pixel electrode array.

18 Claims, 4 Drawing Sheets

(51) Int. Cl.
*G02F 1/161* (2006.01)
*H01L 51/56* (2006.01)
*H01L 51/00* (2006.01)
*H01L 27/12* (2006.01)
*H01L 51/50* (2006.01)

(52) U.S. Cl.
CPC .......... *H01L 51/0004* (2013.01); *H01L 51/56* (2013.01); *H01L 27/1214* (2013.01); *H01L 27/1259* (2013.01); *H01L 51/5012* (2013.01); *H01L 2227/323* (2013.01); *H01L 2251/301* (2013.01); *H01L 2251/556* (2013.01)

(58) Field of Classification Search
CPC ........... H01L 2251/556; H01L 27/1259; H01L 2251/301; H01L 27/1214; H01L 2227/323; G02F 1/161
USPC ............ 257/40, 59, 72, 100; 438/82, 99, 48, 438/128, 157, 283
See application file for complete search history.

(56) References Cited

U.S. PATENT DOCUMENTS

| | | | |
|---|---|---|---|
| 2006/0170338 A1 | 8/2006 | Masuichi et al. | |
| 2007/0246723 A1 | 10/2007 | Moriya et al. | |
| 2007/0269621 A1* | 11/2007 | Mitsuhashi | H01L 27/3246 428/34.1 |
| 2010/0096633 A1* | 4/2010 | Hatano | H01L 27/1214 257/59 |
| 2010/0136220 A1 | 6/2010 | Kitazume | |
| 2010/0213449 A1* | 8/2010 | Yamamoto | H01L 27/3283 257/40 |
| 2012/0313509 A1* | 12/2012 | Takagi | H05B 33/10 313/504 |
| 2014/0342482 A1* | 11/2014 | Morimoto | H01L 51/0005 438/34 |
| 2014/0361260 A1* | 12/2014 | Kim | H01L 27/3246 257/40 |
| 2015/0303393 A1* | 10/2015 | Dai | H01L 51/0004 257/40 |
| 2016/0056218 A1 | 2/2016 | Wang et al. | |
| 2017/0263688 A1 | 9/2017 | Li et al. | |

FOREIGN PATENT DOCUMENTS

| | | |
|---|---|---|
| CN | 101076211 A | 11/2007 |
| CN | 104241329 A | 12/2014 |
| CN | 204257646 U | 4/2015 |
| CN | 105182652 A | 12/2015 |

OTHER PUBLICATIONS

International Search Report and Written Opinion, English Translation.
CN101076211A, English Abstract and U.S. Equivalent U.S. Pub. No. 2007/0269621.
CN1815749A, English Abstract and U.S. Equivalent U.S. Pub. No. 2006/0170338.
CN101060071A, English Abstract and U.S. Equivalent U.S. Pub. No. 2007/0246723.
CN204257646U, English Abstract and Machine Translation.
CN105182652A, English Abstract and U.S. Equivalent U.S. Pub. No. 2017/0263688.
CN104241329A, English Abstract and U.S. Equivalent U.S. Pub. No. 2016/0056218.
First Office Action for Chinese Application No. 201510624357.1, dated Sep. 27, 2017, 9 Pages.
International Search Report and Written Opinion for Application No. PCT/CN2016/075113, dated Jun. 21, 2016, 10 Pages.

* cited by examiner

PIXEL ISOLATION WALL, DISPLAY SUBSTRATE, THEIR MANUFACTURING METHODS, AND DISPLAY DEVICE

CROSS-REFERENCE TO RELATED APPLICATION APPLICATIONS

This application is the U.S. national phase of PCT Application No. PCT/CN2016/075113 filed on Mar. 1, 2016, which claims priority to Chinese Patent Application No. 201510624357.1 filed on Sep. 25, 2015, the disclosures of which are incorporated in their entirety by reference herein.

TECHNICAL FIELD

The present disclosure relates to the field of display technology, in particular to a method for manufacturing a pixel isolation wall, a method for manufacturing a display substrate, the pixel isolation wall, the display substrate, and a display device.

BACKGROUND

A conventional process for manufacturing a display substrate includes a step of dripping a solution prepared by an organic light-emitting material solution into a pixel region, so as to form an organic light-emitting layer. However, it is difficult to precisely drip a droplet of the solution or ink into the given pixel region, and ensure an even thickness of a film formed by the droplet at the pixel region after being dried.

SUMMARY

An object of the present disclosure is to precisely drip a functional display material into a given region and ensure an even thickness of a functional display layer.

In one aspect, the present disclosure provides in some embodiments a pixel isolation wall, including: an oleophilic layer arranged on a substrate on which a thin film transistor (TFT) array and a pixel electrode array is formed; and an oleophobic layer arranged on the oleophilic layer and configured to define, together with the oleophilic layer, a plurality of recess regions corresponding to the pixel electrode array.

Optionally, the oleophilic layer is made of a photoresist having photosensitivity greater than a predetermined value.

Optionally, the oleophobic layer is made of SiNx.

Optionally, an upper surface of the oleophobic layer is subjected to hydrophilization.

In another aspect, the present disclosure provides in some embodiments a display substrate including the above-mentioned pixel isolation wall, the TFT array, the pixel electrode array and an oleophilic functional display layer formed at the recess regions.

Optionally, the functional display layer is made of an organic light-emitting material or an electrochromic material.

In yet another aspect, the present disclosure provides in some embodiments a display device including the above-mentioned display substrate.

In still yet another aspect, the present disclosure provides in some embodiments a method for manufacturing a pixel isolation wall, including steps of: forming an oleophilic layer on a substrate on which a TFT array and a pixel electrode array are formed; forming an oleophobic layer on the oleophilic layer; applying a photoresist onto the oleophobic layer; removing the photoresist at a position corresponding to the pixel electrode array; etching the oleophobic layer at a position corresponding to the pixel electrode array; and etching the oleophilic layer at a position corresponding to the pixel electrode array, so as to enable the oleophilic layer and the oleophobic layer to define a plurality of recess regions corresponding to the pixel electrode array.

Optionally, the step of forming the oleophilic layer includes: applying a material for forming the oleophilic layer onto the substrate on which the TFT array and the pixel electrode array are formed; baking the material for forming the oleophilic layer at a temperature of 80° C. to 100° C. for 3 to 5 minutes; baking the material for forming the oleophilic layer at a temperature of 90° C. to 110° C. for 25 to 35 minutes; and baking the material for forming the oleophilic layer at a temperature of 220° C. to 240° C. for 25 to 35 minutes.

Optionally, the step of etching the oleophilic layer at a position corresponding to the pixel electrode array includes dry-etching the material for forming the oleophilic layer at a position corresponding to the pixel electrode array through oxygen, so as to form a pixel region.

Optionally, the oleophobic layer is made of SiNx, and the step of forming the oleophobic layer on the oleophilic layer includes depositing a SiNx layer having a thickness of 900 Å to 1100 Å through plasma-enhanced chemical vapor deposition (PECVD).

Optionally, the step of etching the oleophobic layer at a position corresponding to the pixel electrode array includes dry-etching the SiNx layer at a position corresponding to the pixel electrode array through $SF_6$ and $Cl_2$.

Optionally, subsequent to the step of forming the oleophobic layer on the oleophilic layer, the method further includes subjecting an upper surface of the oleophobic layer to hydrophilization.

In still yet another aspect, the present disclosure provides in some embodiments a method for manufacturing a display substrate, including the above-mentioned method for forming the pixel isolation wall, and a step of dripping an oleophilic functional display material into the recess regions to form a functional display layer at the recess regions.

According to the embodiments of the present disclosure, the oleophobic layer is formed on the oleophilic layer to form the pixel isolation wall. In the case that the oleophilic functional display material is dripped into the pixel region and falls onto the oleophobic layer, it may be expelled by the oleophobic layer and fall into the pixel region defined by the oleophilic layer, so it is able to precisely drip the oleophilic functional display material into the pixel region. In addition, an inner wall of the pixel isolation wall formed by the oleophilic layer is oleophilic, and after the oleophilic functional display material is dripped into the pixel region, a relatively strong force is exerted in lateral directions by the inner wall to the oleophilic functional display material. As a result, it is able to provide the oleophilic functional display material at the pixel region in an evener manner, i.e., to prevent the material from being accumulated at a center region, thereby to provide the functional display layer with an even thickness.

BRIEF DESCRIPTION OF THE DRAWINGS

The features and advantages of the present disclosure will be more apparent with reference to the drawings. The following drawings are for illustrative purposes only, but shall not be construed as limiting the scope of the present disclosure. In these drawings.

DETAILED DESCRIPTION

In order to make the objects, the features and the advantages of the present disclosure more apparent, the present disclosure will be described hereinafter in conjunction with the drawings and embodiments. It should be appreciated that, the following embodiments and the features therein may be combined in any form in the case of no conflict.

Figure 1:
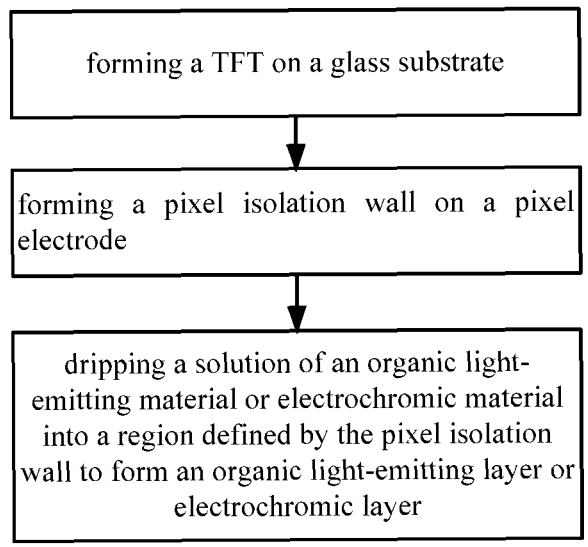
FIG. 1 is a flow chart of a method for manufacturing a display substrate.
Figure 2:
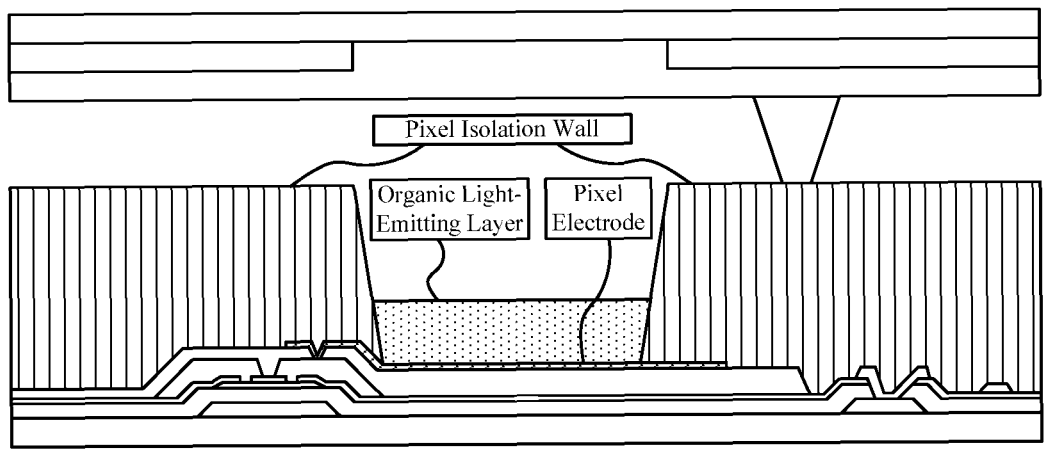
FIG. 2 is a schematic view showing the display substrate.

In the related art, as shown in FIG. 1, a method for manufacturing a display substrate mainly includes forming a TFT on a glass substrate, forming a pixel isolation wall on a pixel electrode, and dripping a solution of an organic light-emitting material into a region defined by the pixel isolation wall to form an organic light-emitting layer. FIG. 2 shows the resultant display substrate.

During the formation of the organic light-emitting layer, usually the pixel isolation wall for separating adjacent pixels from each other needs to be formed between the adjacent pixels, so as to prevent the occurrence of color crosstalk between the adjacent pixels.

Figure 3:
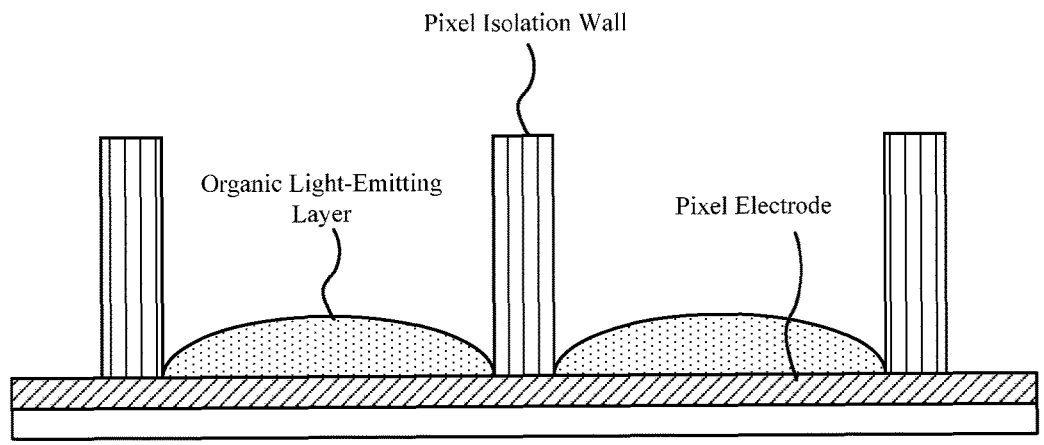
FIG. 3 is a schematic view showing an organic light-emitting layer or electrochromic layer.

In the related art, the step of forming the pixel isolation wall may include applying a photoresist to a surface of the pixel electrode, and exposing the photoresist with a mask plate. After the photoresist is irradiated with light, it may be decomposed in the case that it is positive, and it may be polymerized in the case that it is negative. Taking the positive photoresist as an example, the photoresist at a position corresponding to a light-transmitting region of the mask plate may be removed, and the remaining photoresist may serve as the pixel isolation wall. After the formation of the pixel isolation wall, usually the pixel isolation wall at a given pixel region needs to be lyophobic, so as to precisely drip the solution of the organic light-emitting material or ink into the given pixel region. In this way, even in the case that a small amount of droplets fall onto the pixel isolation wall, they may also flow into a pixel groove due to the lyophobic characteristic of the pixel isolation wall. In this regard, as shown in FIG. 3, although the organic light-emitting layer formed by ink-jet printing may completely flow into the pixel groove, a protrusion may be generated due to the lyophobic characteristic of the pixel isolation wall. As a result, the resultant organic light-emitting layer may have an uneven thickness.

Hence, it is difficult to precisely drip a droplet of the solution or ink into the given pixel region, and at the same time ensure an even thickness of a film formed by the droplet at the pixel region after being dried.

The present disclosure will be described hereinafter in conjunction with the drawings and embodiments. The following embodiments are for illustrative purposes only, but shall not be used to limit the scope of the present disclosure.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "connect" or "connected to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

Figure 4:
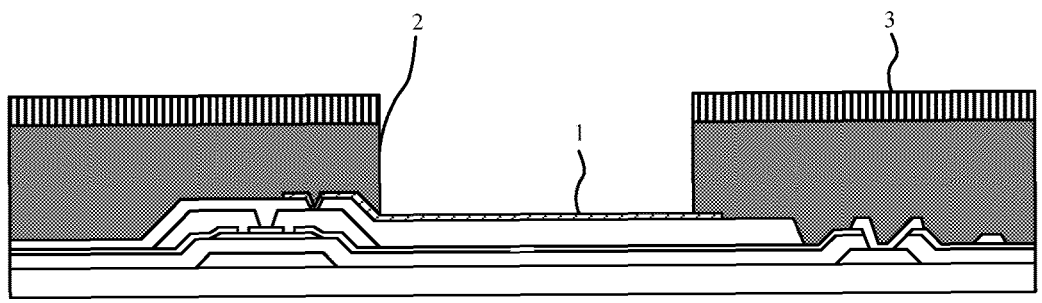
FIG. 4 is a schematic view showing a pixel isolation wall according to one embodiment of the present disclosure.

As shown in FIG. 4, the present disclosure provides in some embodiments a pixel isolation wall, which includes: an oleophilic layer 2 arranged on a substrate on which TFT array and a pixel electrode array 1 is formed; and an oleophobic layer 3 arranged on the oleophilic layer 2 and configured to define, together with the oleophilic layer 2, a plurality of recess regions corresponding to the pixel electrode array.

Figure 5:
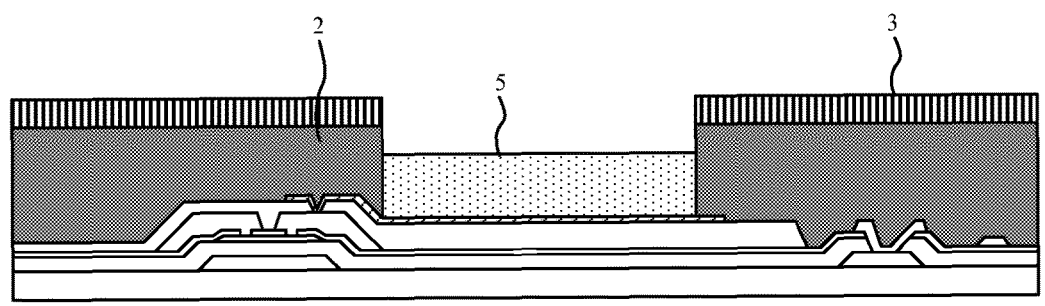
FIG. 5 is a schematic view showing a display substrate according to one embodiment of the present disclosure.

According to the embodiments of the present disclosure, the oleophobic layer 3 is formed on the oleophilic layer 2 to form the pixel isolation wall. In the case that an oleophilic functional display material is dripped into the pixel region to form an oleophilic functional display layer 5 and meanwhile falls onto the oleophobic layer 3, it may be expelled by the oleophobic layer 3 and fall into the pixel region defined by the oleophilic layer 2, so it is able to precisely drip the oleophilic functional display material into the pixel region. In addition, an inner wall of the pixel isolation wall formed by the oleophilic layer 2 is oleophilic, and after the oleophilic functional display material is dripped into the pixel region, a relatively strong force is exerted in lateral directions by the inner wall to the oleophilic functional display material. As a result, it is able to provide the oleophilic functional display material at the pixel region in an evener manner, i.e., to prevent the material from being accumulated at a center region, thereby to provide the oleophilic functional display layer 5 with an even thickness, as shown in FIG. 5.

Optionally, the oleophilic layer 2 is made of a photoresist 4 having photosensitivity greater than a predetermined value.

The photoresist 4 having the photosensitivity greater than the predetermined value may be, for example, a positive photoresist FMES-TF20 manufactured by Fuji Film Company, so as to facilitate the formation of the oleophilic layer 2 having a relatively large thickness, thereby to enable the oleophilic layer 2, as the pixel isolation wall, to define the pixel region in a better manner.

Optionally, the oleophobic layer 3 is made of SiNx.

In the embodiments of the present disclosure, SiNx is an oleophobic (hydrophilic) material, and in the case that the oleophilic functional display material is dripped onto the SiNx layer, it may be expelled by the SiNx layer and easily fall into the pixel region defined by the oleophilic layer 2.

Optionally, an upper surface of the oleophobic layer 3 is subjected to hydrophilization.

In the case that the oleophobic layer 3 having relatively strong oleophobicity is required during the manufacture process, the oleophobic layer 3 may be further subjected to hydrophilization, so as to enable the oleophilic functional display material on the oleophobic layer 3 to flow into the pixel region more quickly.

The present disclosure further provides in some embodiments a display substrate including the abovementioned pixel isolation wall, a TFT array and a pixel electrode array 1, and the oleophilic functional display layer 5 formed at the recess regions.

Optionally, the functional display layer 5 is made of an organic light-emitting material or an electrochromic material.

In the case that the functional display layer 5 is made of the organic light-emitting material, the resultant display substrate may be applied to an organic light-emitting diode (OLED) display device, and in the case that it is made of the electrochromic material, resultant display substrate may be applied to an active matrix electrochromic display (AMECD) device.

The present disclosure further provides in some embodiments a display device including the above-mentioned display substrate.

It should be appreciated that, the display device may be any product or member having a display function, such as an electronic paper, a mobile phone, a flat-panel computer, a television, a laptop computer, a digital photo frame or a navigator.

Figure 6:
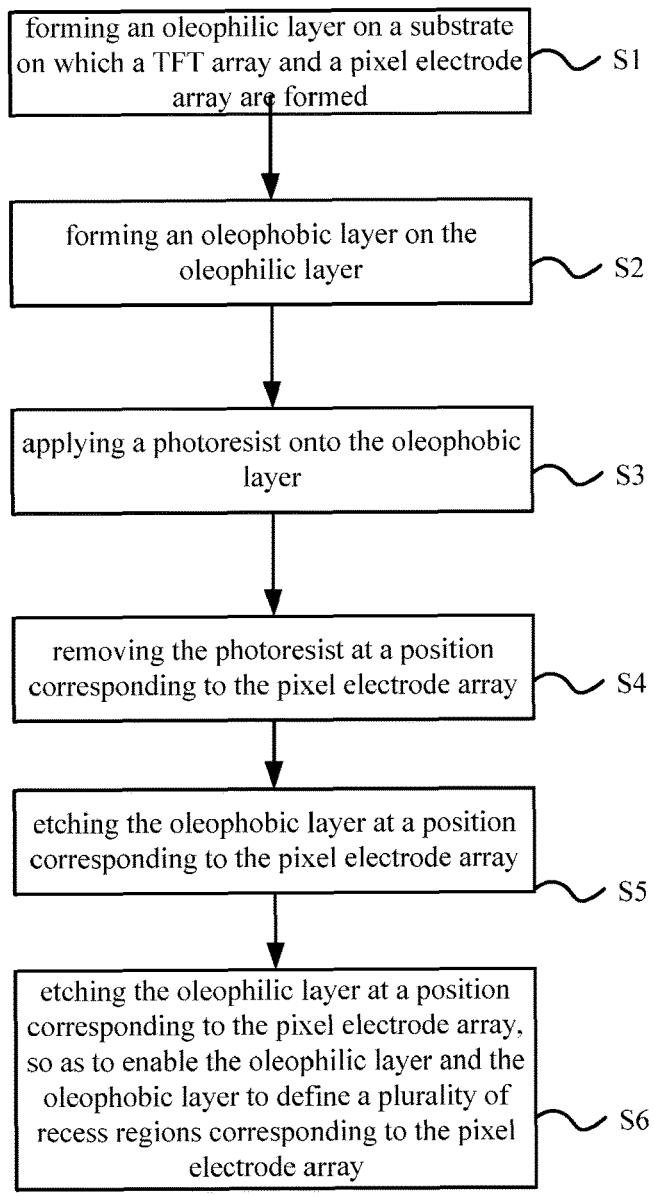
FIG. 6 is a flow chart of a method for manufacturing the pixel isolation wall according to one embodiment of the present disclosure.
Figure 7:
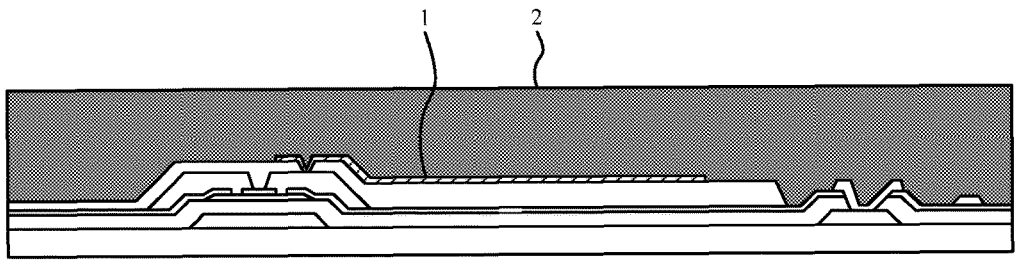
FIGS. 7-11 are schematic views showing the method for manufacturing the pixel isolation wall according to one embodiment of the present disclosure.
Figure 8:
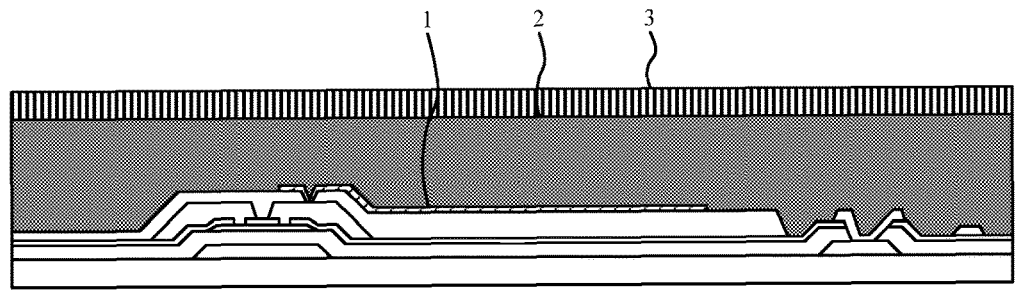
Figure 9:
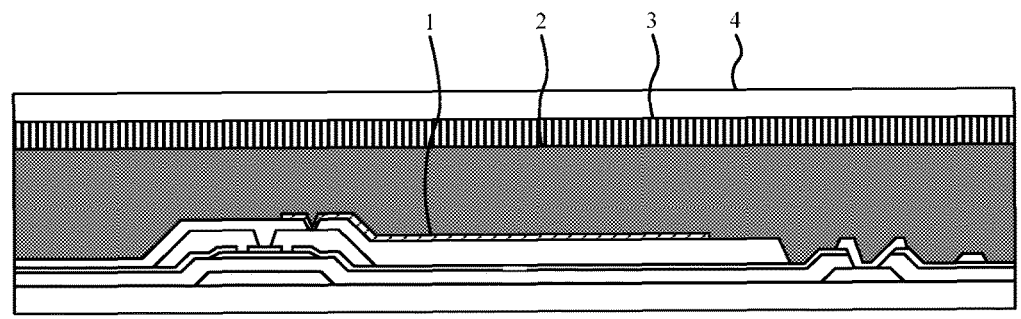
Figure 10:
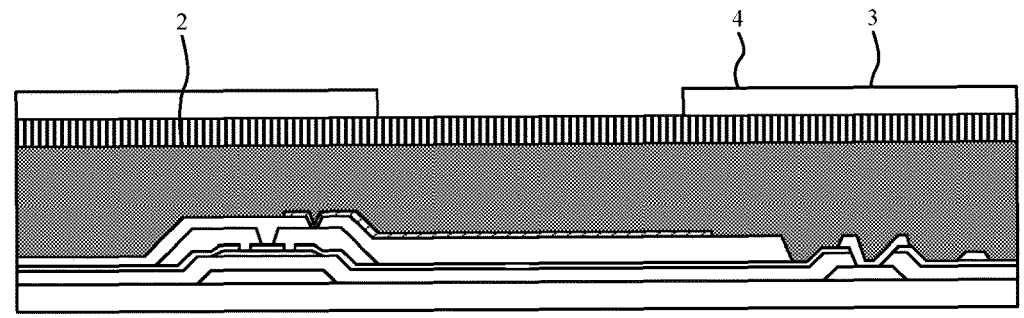
Figure 11:
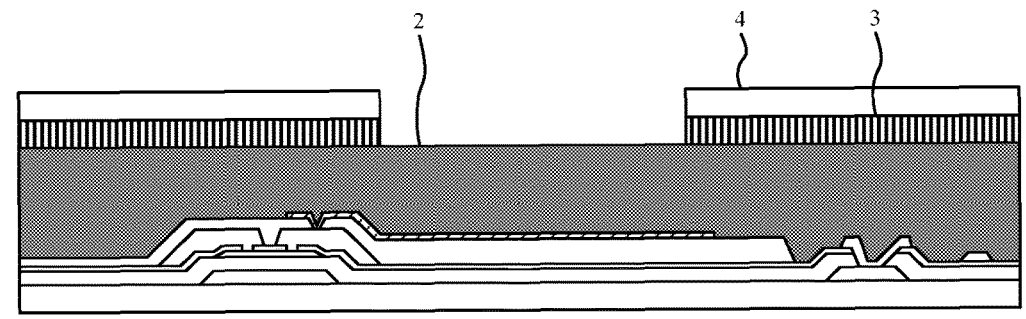

As shown in FIG. 6, the present disclosure provides in some embodiments a method for manufacturing the pixel isolation wall, which includes: Step S1 of forming the oleophilic layer 2 on the substrate on which the TFT array and the pixel electrode array 1 are formed, as shown in FIG. 7; forming the oleophobic layer 3 on the oleophilic layer 2, as shown in FIG. 8; applying the photoresist 4 onto the oleophobic layer 3, as shown in FIG. 9; removing the photoresist 4 at a position corresponding to the pixel electrode array 1 (e.g., through exposing and developing), as shown in FIG. 10; etching the oleophobic layer 3 at a position corresponding to the pixel electrode array 1, as shown in FIG. 11; and etching the oleophilic layer 2 at a position corresponding to the pixel electrode array 1 so as to enable the oleophilic layer 2 and the oleophobic layer 3 to define a plurality of recess regions corresponding to the pixel electrode array, i.e., to form the pixel isolation wall through the oleophilic layer 2 and the oleophobic layer 3, and then removing the remaining photoresist 4, as shown in FIG. 4.

The oleophobic layer 3 and the oleophilic layer 2 to be etched off are arranged at the positions corresponding to the pixel electrode array 1, so it is able to etch them off through a single masking process, i.e., the manufacture process may be simplified.

Optionally, the step of forming the oleophilic layer 2 includes: applying a material for forming the oleophilic layer 2 onto the substrate on which the TFT array and the pixel electrode array 1 are formed; baking the material for forming the oleophilic layer 2 at a temperature of 80° C. to 100° C., e.g., 90° C., for 3 to 5 minutes, e.g., 4 minutes; baking the material for forming the oleophilic layer at a temperature of 90° C. to 110° C., e.g., 100° C., for 25 to 35 minutes, e.g., 30 minutes; and baking the material for forming the oleophilic layer 2 at a temperature of 220° C. to 240° C., e.g., 230° C., for 25 to 35 minutes, e.g., 30 minutes.

Through three baking steps, it is able to cure the oleophilic layer 2 completely.

Optionally, the step of etching the oleophilic layer 2 at a position corresponding to the pixel electrode array 1 includes dry-etching the material for forming the oleophilic layer 2 at a position corresponding to the pixel electrode array 1 through oxygen, so as to form the pixel region.

Optionally, the oleophobic layer 3 is made of SiNx.

Optionally, the step of forming the oleophobic layer 3 on the oleophilic layer 2 includes depositing a SiNx layer having a thickness of 900ø to 1100ø through PECVD. Optionally, the SiNx layer having a thickness of 1000ø may be deposited, so as to ensure an excellent oleophobic effect and prevent a thickness of the substrate from being adversely affected.

Optionally, the step of etching the oleophobic layer at a position corresponding to the pixel electrode array 1 includes dry-etching the SiNx layer at a position corresponding to the pixel electrode array through $SF_6$ and $Cl_2$.

Optionally, subsequent to the step of forming the oleophobic layer 3 on the oleophilic layer 2, the method further includes subjecting an upper surface of the oleophobic layer 3 to hydrophilization.

The present disclosure further provides in some embodiments a method for manufacturing the display substrate, which includes the above-mentioned for forming the pixel isolation wall, and a step of dripping the oleophilic functional display material into the recess regions to form the functional display layer 5 at the recess regions.

During the manufacture of the display substrate, a film-forming process (e.g., deposition and sputtering) and a patterning process (e.g., etching) may be adopted.

The present disclosure has been described hereinbefore in conjunction with the drawings and embodiments. In the related art, it is difficult to precisely drip a droplet of the solution or ink into the given pixel region and ensure an even thickness of a film formed by the droplet at the pixel region after being dried. However, according to the embodiments of the present disclosure, the oleophobic layer is formed on the oleophilic layer to form the pixel isolation wall. In the case that the oleophilic functional display material is dripped into the pixel region and falls onto the oleophobic layer, it may be expelled by the oleophobic layer and fall into the pixel region defined by the oleophilic layer, so it is able to precisely drip the oleophilic functional display material into the pixel region. In addition, an inner wall of the pixel isolation wall formed by the oleophilic layer is oleophilic, and after the oleophilic functional display material is dripped into the pixel region, a relatively strong force is exerted in lateral directions by the inner wall to the oleophilic functional display material. As a result, it is able to provide the oleophilic functional display material at the pixel region in an evener manner, i.e., to prevent the material from being accumulated at a center region, thereby to provide the functional display layer with an even thickness.

It should be appreciated that, for clarity, scales of the layers and the regions in the drawings may be exaggerated. It should be further appreciated, in the case that one element or layer is formed on another element or layer, it may be directly formed on the other element or layer, or an intermediate element or layer may be formed between it and the other element or layer. Similarly, in the case that one element or layer is formed under another element or layer, it may be directly formed under the other element or layer, or an intermediate element or layer may be formed between it and the other element or layer. In addition, in the case that one element or layer is formed between two elements or layers, it may be a unique one, or at least one another intermediate element or layer may be formed between the two elements or layers. Further, an identical reference signal may refer to an identical element.

The above are merely the preferred embodiments of the present disclosure, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A display substrate, comprising a pixel isolation wall, a thin film transistor (TFT) array, a pixel electrode array, and an oleophilic functional display layer, wherein the pixel isolation wall is on the TFT array and the pixel electrode array and comprises an oleophilic layer and an oleophobic layer arranged on the oleophilic layer, the oleophobic layer is configured to define, together with the oleophilic layer, a plurality of recess regions corresponding to the pixel electrode array, a side surface of the oleophilic layer defining one recess region of the plurality of recess regions and a side surface of the oleophobic layer defining a same one recess region are in a same vertical plane, and the oleophilic functional display layer is formed at the plurality of recess regions, and a upper surface of the oleophilic functional display layer is lower than that of the oleophilic layer, and a side surface of the oleophilic functional display layer at one recess region of the plurality of recess regions directly contacts with the side surface of the oleophilic layer defining the one recess region.

2. The display substrate according to claim 1, wherein the oleophilic layer is made of a photoresist.

3. The display substrate according to claim 1, wherein the oleophobic layer is made of SiNx.

4. The display substrate according to claim 1, wherein an upper surface of the oleophobic layer is subjected to hydrophilization.

5. The display substrate according to claim 1, wherein the functional display layer is made of an organic light-emitting material or an electrochromic material.

6. A display device, comprising the display substrate according to claim 1.

7. A method for manufacturing a display substrate, comprising steps of:

forming an oleophilic layer on a substrate on which a thin film transistor (TFT) array and a pixel electrode array are formed;

forming an oleophobic layer on the oleophilic layer;

applying a photoresist onto the oleophobic layer;

removing the photoresist at a position corresponding to the pixel electrode array;

etching the oleophobic layer at a position corresponding to the pixel electrode array;

etching the oleophilic layer at a position corresponding to the pixel electrode array to enable the oleophilic layer and the oleophobic layer to define a plurality of recess regions corresponding to the pixel electrode array, wherein a side surface of the oleophilic layer defining one recess region of the plurality of recess regions and a side surface of the oleophobic layer defining a same one recess region are in a same vertical plane, and dripping an oleophilic functional display material into the recess regions to form an oleophilic functional display layer at the recess regions, wherein a upper surface of the oleophilic functional display layer is lower than that of the oleophilic layer, and a side surface of the oleophilic functional display layer at one recess region of the plurality of recess regions directly contacts with the side surface of the oleophilic layer defining the one recess region.

8. The method according to claim 7, wherein the step of forming the oleophilic layer comprises:

applying a material for forming the oleophilic layer onto the substrate on which the TFT array and the pixel electrode array are formed;

baking the material for forming the oleophilic layer at a temperature of 80° C. to 100° C. for 3 to 5 minutes;

baking the material for forming the oleophilic layer at a temperature of 90° C. to 110° C. for 25 to 35 minutes; and baking the material for forming the oleophilic layer at a temperature of 220° C. to 240° C. for 25 to 35 minutes.

9. The method according to claim 8, wherein the step of etching the oleophilic layer at a position corresponding to the pixel electrode array comprises dry-etching the material for forming the oleophilic layer at a position corresponding to the pixel electrode array through oxygen to form a pixel region.

10. The method according to claim 7, wherein the oleophobic layer is made of SiNx, and the step of forming the oleophobic layer on the oleophilic layer comprises depositing a SiNx layer having a thickness of 900 Å to 1100 Å through plasma-enhanced chemical vapor deposition (PECVD).

11. The method according to claim 10, wherein the step of etching the oleophobic layer at a position corresponding to the pixel electrode array comprises dry-etching the SiNx layer at a position corresponding to the pixel electrode array through $SF_6$ and $Cl_2$.

12. The method according to claim 7, wherein subsequent to the step of forming the oleophobic layer on the oleophilic layer, the method further comprises subjecting an upper surface of the oleophobic layer to hydrophilization.

13. The display substrate according to claim 2, wherein an upper surface of the oleophobic layer is subjected to hydrophilization.

14. The display substrate according to claim 3, wherein an upper surface of the oleophobic layer is subjected to hydrophilization.

15. A display device, comprising the display substrate according to claim 5.

16. The display substrate according to claim 2, wherein the photoresist has a photosensitivity greater than a predetermined value.

17. The display substrate according to claim 3, wherein the oleophobic layer has a thickness of 900 Å to 1100 Å.

18. The display substrate according to claim 17, wherein the oleophobic layer has a thickness of 1000 Å.

* * * * *